(12) United States Patent
Kim et al.

(10) Patent No.: US 9,666,690 B2
(45) Date of Patent: May 30, 2017

(54) INTEGRATED CIRCUIT AND METHOD FOR FABRICATING THE SAME HAVING A REPLACEMENT GATE STRUCTURE

(75) Inventors: Hoon Kim, Guilderland, NY (US); Kisik Choi, Hopewell Junction, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 74 days.

(21) Appl. No.: 13/462,619

(22) Filed: May 2, 2012

(65) Prior Publication Data
US 2013/0292744 A1 Nov. 7, 2013

(51) Int. Cl.
*H01L 29/66* (2006.01)
*H01L 21/8238* (2006.01)

(52) U.S. Cl.
CPC .. *H01L 29/66795* (2013.01); *H01L 21/82385* (2013.01); *H01L 21/823821* (2013.01); *H01L 21/823842* (2013.01); *H01L 21/823857* (2013.01); *H01L 29/66545* (2013.01); *H01L 29/66553* (2013.01)

(58) Field of Classification Search
CPC ......... H01L 29/66795; H01L 29/66545; H01L 21/823821
USPC .......................... 438/197, 169, 154; 257/288
See application file for complete search history.

(56) References Cited

U.S. PATENT DOCUMENTS

| | | | | |
|---|---|---|---|---|
| 8,404,544 | B1 * | 3/2013 | Yin et al. ...................... | 438/275 |
| 2005/0051854 | A1 * | 3/2005 | Cabral et al. ................. | 257/407 |
| 2006/0131659 | A1 * | 6/2006 | Belyansky et al. ........... | 257/369 |
| 2010/0081240 | A1 * | 4/2010 | Yagishita ...................... | 438/151 |
| 2010/0327377 | A1 * | 12/2010 | Dewey et al. ................. | 257/411 |
| 2011/0215409 | A1 * | 9/2011 | Li et al. ........................ | 257/351 |
| 2012/0132998 | A1 * | 5/2012 | Kwon et al. .................. | 257/369 |

* cited by examiner

*Primary Examiner* — Charles Garber
*Assistant Examiner* — Brigitte Paterson
(74) *Attorney, Agent, or Firm* — Lorenz & Kopf, LLP

(57) ABSTRACT

An integrated circuit includes a first replacement gate structure. The first replacement gate structure includes a layer of a first barrier material that is less than 20 Å in thickness and a layer of a p-type workfunction material. The replacement gate structure is less than about 50 nm in width.

18 Claims, 4 Drawing Sheets

INTEGRATED CIRCUIT AND METHOD FOR FABRICATING THE SAME HAVING A REPLACEMENT GATE STRUCTURE

TECHNICAL FIELD

Embodiments of the subject matter described herein relate generally to integrated circuits and methods for fabricating integrated circuits. More particularly, the subject matter relates to integrated circuits and methods for fabricating integrated circuits having a replacement gate structure.

BACKGROUND

The prior art is replete with different techniques and processes for fabricating semiconductor devices such as metal oxide semiconductor (MOS) integrated circuits. In accordance with typical fabrication techniques, a MOS integrated circuit is formed by creating a device structure on a semiconductor substrate, where the device structure includes a gate stack formed on a layer of semiconductor material, and source and drain regions formed in the semiconductor material to define a channel region under the gate stack. Some integrated circuit devices are fabricated using a replacement gate technique; in accordance with this technique, temporary gate material (typically polycrystalline or amorphous silicon) is removed, temporarily forming a trench-like structure (hereinafter "trench"), and then replaced (filled) with a different gate metal.

Current replacement gate metal fill processes for p-type MOS integrated circuits (PMOS) include the conformal deposition, typically by atomic layer deposition (ALD), of a thin layer of barrier material, such as a titanium nitride material, followed by the deposition, typically by chemical vapor deposition (CVD) of a tungsten or aluminum metal. However, as semiconductors are scaled smaller, for example in the 20 nm generation and smaller, the thin barrier material layer takes up a larger and larger percentage of the volume of the trench, and as such increases the resistivity of the gate beyond desirable levels. For example, in combination with tungsten or aluminum, greater than 50 Å (in thickness) of barrier material (e.g., titanium nitride) is required to achieve a p-type workfunction. 50 Å takes up a significant percentage of the volume of the trench, and therefore creates an undesirably high resistance in the gate structure (known as line resistance). Furthermore, some traditional metals, such as aluminum materials, tend to form voids if the trench is too small, for example in the size of trench that is typically formed in 20 nm and smaller generation devices.

As such, it would be desirable to provide a replacement gate material fill technique that overcomes the above-noted difficulties currently encountered in the art. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Integrated circuits and methods of fabricating integrated circuits are provided herein. In an exemplary embodiment, a method of fabricating a semiconductor device includes depositing a layer of a first barrier material, depositing a layer of an n-type workfunction material over the layer of the first barrier material, etching the layer of the first barrier material and the layer of the n-type workfunction material from a first area, depositing a layer of a second barrier material, and depositing a layer of a p-type workfunction material.

In another exemplary embodiment, an integrated circuit includes a first replacement gate structure. The first replacement gate structure includes a layer of a first barrier material that is less than 20 Å in thickness and a layer of a p-type workfunction material. The replacement gate structure is less than 50 nm in width.

In yet another exemplary embodiment, a method of fabricating an integrated circuit includes depositing a layer of a hafnium carbide material; depositing a layer of an ytterbium silicide workfunction material over the layer of the hafnium carbide material; etching the layer of the hafnium carbide material and the layer of the ytterbium silicide workfunction material from a first area; depositing a layer of a titanium nitride material; and depositing a layer of a cobalt metal or a nickel metal.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, and wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based integrated circuits are well known and so, in the interest of brevity, many conventional steps will only be mentioned briefly herein or will be omitted entirely without providing the well known process details.

The techniques and technologies described herein may be utilized to fabricate MOS integrated circuit devices, including NMOS integrated circuit devices, PMOS integrated circuit devices, and CMOS integrated circuit devices. In particular, the process steps described here can be utilized in conjunction with any semiconductor device fabrication process that forms gate structures for integrated circuits, including both planar and non-planar integrated circuits. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. For example, the following figures depict the subject matter of the present disclosure as would be implemented on an exemplary FinFET structure (a three-dimensional field effect transistor (FET) provided in an elongate rectangular shape (the "fin") with the gate structure provide over three sides thereof), which are currently well known in the art.

Figure 1:
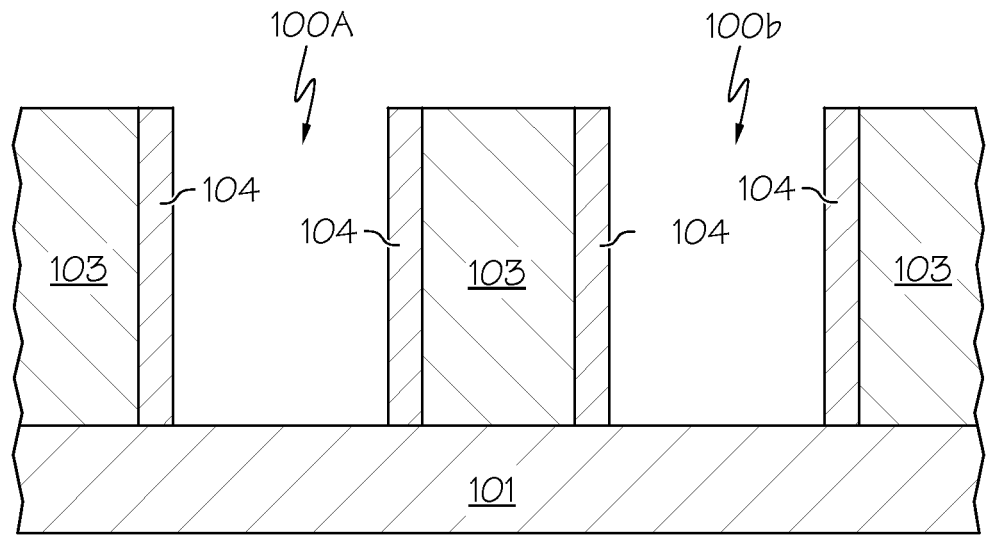
FIGS. 1-7 are cross-sectional views of an integrated circuit illustrating methods for fabricating an integrated circuit having a replacement gate structure in accordance with the present disclosure.

With reference to FIG. 1, in one embodiment, depicted is a cross-sectional view of a partially-formed integrated circuit (IC) prior to forming the replacement gate structure therein. In particular, the IC has been designed to have formed therein a p-type FET (pFET) and an n-type FET (nFET). However, it will be appreciated that a given integrated circuit design may include any number of pFETs and/or nFETs. As such, FIG. 1 and the figures that follow are intended to be illustrative of the techniques that can be implemented on any type of IC including pFETs and/or nFETs.

The semiconductor substrate shown in FIG. 1 includes a silicon material substrate 101. Above the silicon substrate 100 are two trench-like voids 100a and 100b (hereinafter "trenches"), one each for the pFET (100a) and the nFET (100b) to be formed. The trenches 100a, 100b are formed in a layer of oxide material 103, for example silicon dioxide, which as shown in FIG. 1 is formed above the silicon substrate 101. Sidewall spacers 104 are present on either side of the trenches 100. As such, FIG. 1 depicts the IC at a stage in the replacement gate forming process, prior to the deposition of any barrier or workfunction materials, that is conventional and well-known in the so-called "gate last" technological arts related to ICs. As such, greater details regarding the patterning and formation of the trenches 100a, 100b in the oxide layer 103, and the formation of the sidewall spacers 104 need not be provided.

Figure 2:
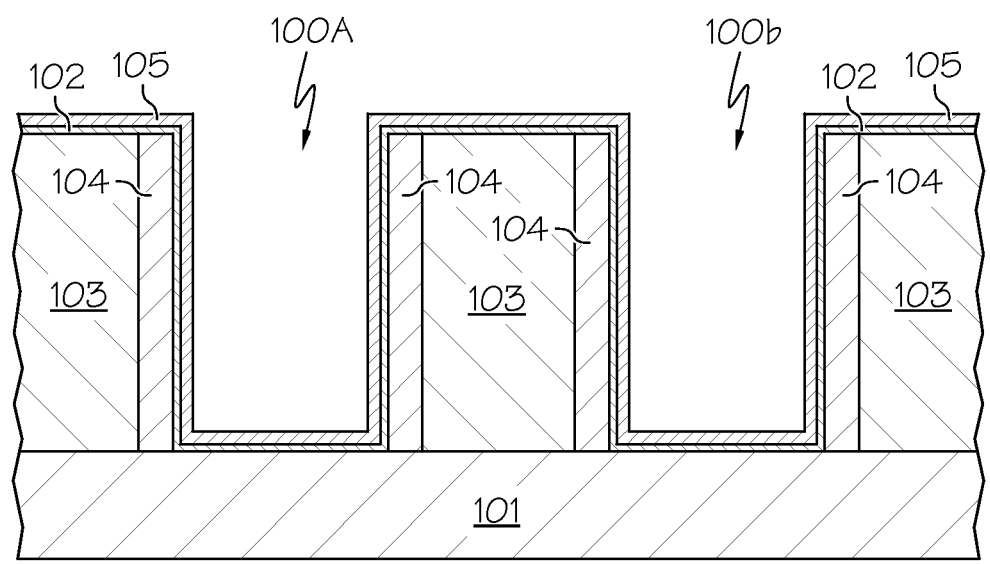

The process for forming a replacement gate structure, in one embodiment, continues with reference to FIG. 2. FIG. 2 shows that a layer of a barrier material 105, for example a hafnium carbide material, that is conformally deposited over an insulator layer 102, for example silicon dioxide or a high-k dielectric, that itself has been conformally deposited over the oxide layer 103, including within the trenches 100a, 100b and along the sidewall spacers 104. In this embodiment, a hafnium carbide material was selected as the barrier material due to its good thermal stability, although other barrier materials may be used in other embodiments. The barrier material layer 105 can be conformally deposited using, for example, ALD.

Figure 3:
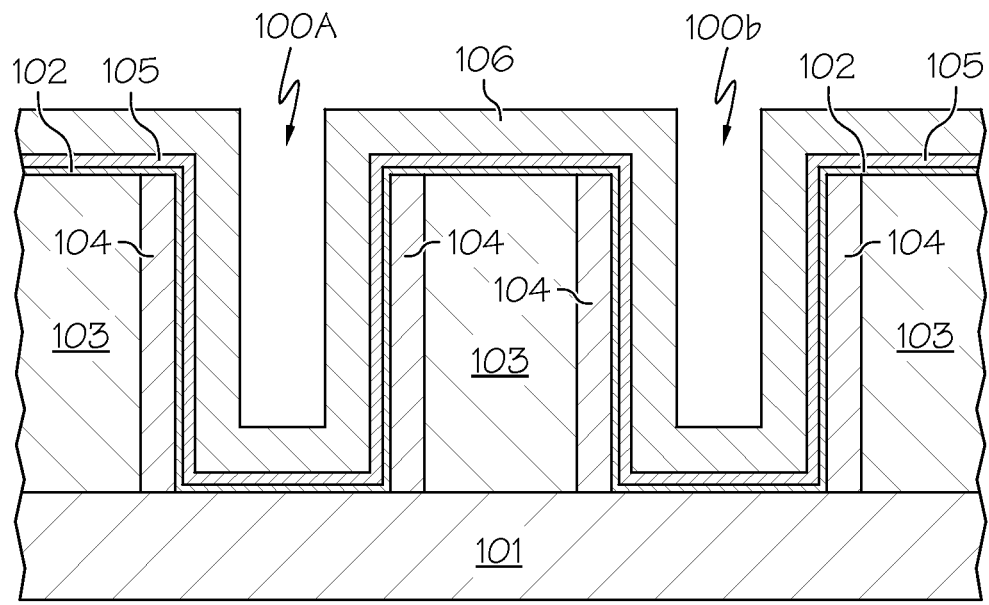

With reference now to FIG. 3, in one embodiment, the process continues with the conformal deposition of a layer 106 of an n-type metal. For example, in this embodiment, the n-type metal is an ytterbium silicide, for example $YbSi_2$. $YbSi_2$ has a low workfunction value, particularly suitable for an n-type metal, and also has a low resistivity, typically less than about 50 µOhm-cm. The n-type metal layer 106 is deposited so as to conform over both the n-side and the p-side trenches 100a, 100b. For example, ALD may be employed as a suitable deposition technique for this process step.

Figure 4:
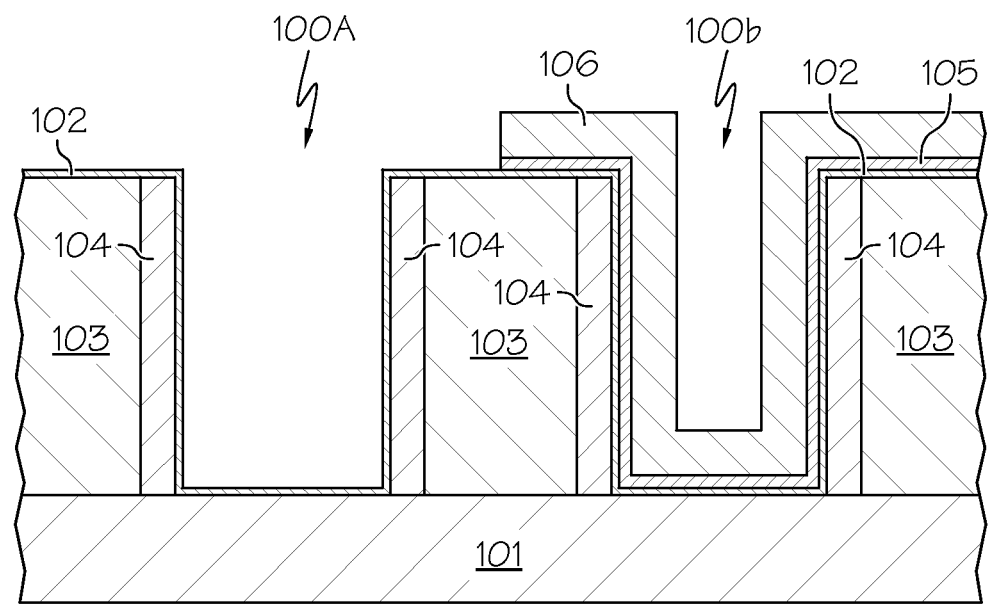

With reference now to FIG. 4, the process includes one or more etching and polishing steps. For example, as shown in FIG. 4, the barrier layer 105 and the n-type material layer 106 has been etched from the p-side of the semiconductor device by screening the nFET side by a photoresist or other masking materials. The etching is performed so as to stop on the insulator layer 102. Conventional techniques for patterned etching are well known in the art, and include, for example, the patterning of a photo-resist material followed by etching, for example with an anisotropic etchant, as in known in the art.

Figure 5:
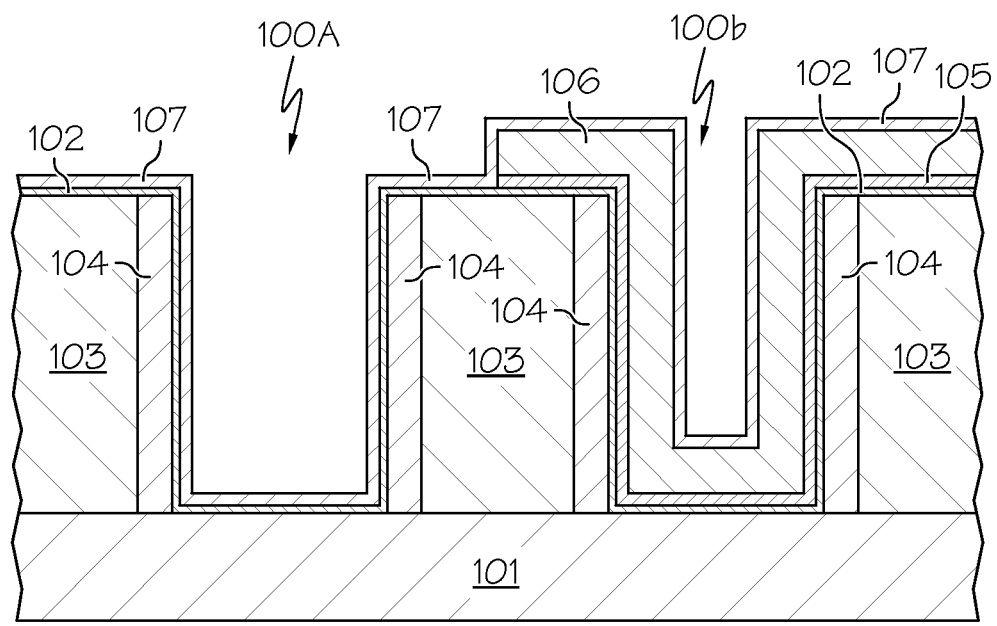

With reference now to FIG. 5, in one embodiment, the process continues with the deposition of a thin (for example, less than about 20 Å in thickness) barrier material layer 107. For example, the barrier material layer 107 can include a titanium nitride material. Titanium nitride is a well-known barrier material, and is commonly deposited in a conformal layer using ALD, although other deposition techniques may be used. The barrier material layer 107 is deposited across the semiconductor device, and as such it is deposited over the n-type workfunction material layer 106 and into the trenches 100a, 100b and along the sidewall spacers 104 of the pFET side of the IC.

Figure 6:
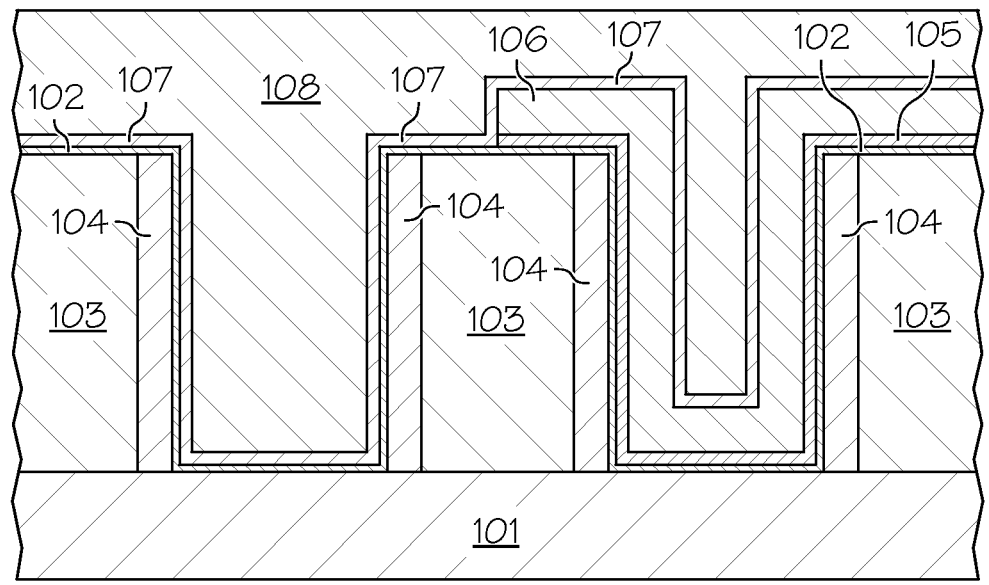

FIG. 6 depicts a further process step of the presently disclosed subject matter, and, in one embodiment, includes the blanket deposition of a p-type workfunction material layer 108 across the semiconductor device. For example, the p-type workfunction material can include can include cobalt metal or nickel metal. Cobalt and nickel both have relatively high workfunction values, and are therefore suitable for use as a p-metal (Co has a workfunction of about 4.9 eV, and Ni has a workfunction of about 5.1; it is expected that one having ordinary skill in the art will be able to select an appropriate metal in accordance with a given design of an IC). Furthermore, cobalt and nickel metal are suitable for use herein as a p-metal due to the fact that CVD processes have been well-developed for each, and are consequently well-known in the art. Still further, cobalt and nickel are desirable for their relatively low resistivity (Co has a resistivity of about 6.2 µOhm-cm and Ni has a resistivity of about 6.9 µOhm-cm). As shown in FIG. 6, the p-type metal workfunction material layer 108 is blanket deposited into the trench on the n-side of the device 100b to fill the device, in addition to filling the trench 100a of the p-side of the device.

Figure 7:
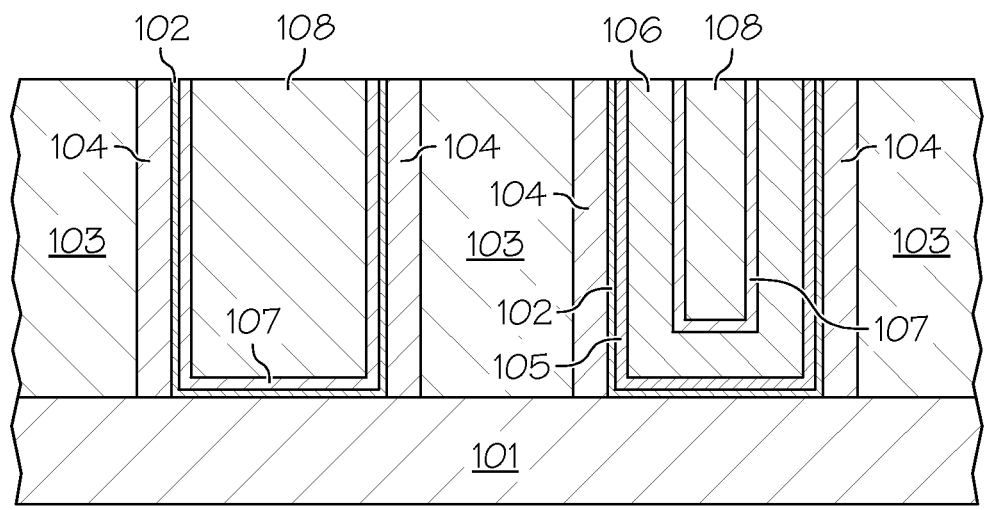

Thereafter, as shown in FIG. 7, and in accordance with one embodiment, further processing steps can be performed to fabricate the integrated circuit, as are well-known in the art. For example, FIG. 7 depicts a polishing step, such as chemical-mechanical-planarization (CMP) to form the completed replacement gate structures. Further steps (not shown) conventionally include, for example, the etching of the gate structures and capping with a silicon nitride material, the formation of contacts, removal of the oxide layer 103, and formation of one or more patterned conductive layer across the device with dielectric layers thereinbetween, among many others. The subject matter disclosed herein is not intended to exclude any subsequent processing steps to form and test the completed IC as are known in the art. Furthermore, with respect to any of the process steps described above, one or more heat treating and/or annealing procedures can be employed after the deposition of a layer, as is commonly known in the art.

Furthermore, while the Figures presented herein have been directed to a non-planar, "fin"-type device (i.e., a "FinFET" device), the methods described herein may be employed similarly, in other embodiments, on planar devices as well. Still further, while the Figures presented herein have been direct to a "gate last" IC fabrication process, the methods described herein may be employed in other embodiments in connection with "gate first" IC fabrication processes. For example, after the process steps described above with regard to FIG. 3, in a gate first process, an exemplary method would proceed with one or more lithographic patterning and etching steps to form the gate structures (of course, the voids 100a, 100b would not be present, and the layers 102, 105, 106, 107, and 108 would be deposited over the silicon material substrate 100 including previously formed n- and p-wells).

As such, the subject matter disclosed herein, in one embodiment, includes an integrated circuit fabrication technique for forming a replacement gate structure that has numerous advantages over techniques conventionally employed in the art. For example, the deposition of cobalt or nickel is a far simpler and more reliable process than the conventional ALD of titanium nitride followed by the CVD of tungsten or aluminum. Further, as a barrier layer in combination with cobalt or nickel, titanium nitride is only needed at a thickness of less than about 20 Å, whereas in combination with aluminum or tungsten greater than 50 Å is required to achieve the same p-type work function. Thus, resistance is reduced on the p-side due to the relatively lower percentage of titanium nitride barrier material required. The methods and devices of the present disclosure are particularly suitable for replacement gate structure that are less than about 50 nm in width, for example less than about 30 nm in width, such as less than about 20 nm in width.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating an integrated circuit, comprising:
    forming or providing a semiconductor substrate consisting of a silicon material with a layer of a silicon oxide material directly overlying and in physical contact with the semiconductor substrate, wherein first and second void spaces are formed in the silicon oxide material thereby exposing first and second upper surface portions of the semiconductor substrate;
    depositing a layer of an insulator material directly over and in physical contact with the silicon oxide material, within the first and second void spaces, and directly over and in physical contact with the silicon material of the first and second upper surface portions;
    depositing a layer of a first barrier material directly over and in physical contact with the layer of the insulator material so as to be present over the silicon oxide material, within the first and second void spaces, and over the first and second upper surface portions;
    depositing a layer of an n-type workfunction material directly over and in physical contact with the layer of the first barrier material;
    etching the layer of the first barrier material and the layer of the n-type workfunction material from a first area, wherein the first area includes at least an entirety of the first void space but does not include any of the second void space;
    depositing a layer of a second barrier material; and
    depositing a layer of a p-type workfunction material.

2. The method of claim 1, wherein depositing the layer of the first barrier material comprises depositing a layer of a hafnium carbide.

3. The method of claim 1, wherein depositing the layer of the n-type workfunction material comprises depositing a layer of an ytterbium silicide.

4. The method of claim 3, wherein depositing the layer of the ytterbium silicide comprises depositing a layer of $YbSi_2$.

5. The method of claim 1, wherein depositing the layer of the second barrier material comprises depositing a layer of a titanium nitride.

6. The method of claim 5, wherein depositing the layer of the titanium nitride material comprises depositing a layer of less than 20Å in thickness.

7. The method of claim 1, wherein depositing the layer of the p-type workfunction material comprises depositing a layer of cobalt metal.

8. The method of claim 1, wherein depositing the layer of the p-type workfunction material comprises depositing a layer of nickel metal.

9. A method of fabricating an integrated circuit, comprising:
    forming or providing a semiconductor substrate consisting of a silicon material with a layer of a silicon oxide material directly overlying and in physical contact with the semiconductor substrate, wherein first and second void spaces are formed in the silicon oxide material thereby exposing first and second upper surface portions of the semiconductor substrate;
    depositing a layer of an insulator material directly over and in physical contact with the silicon oxide material, within the first and second void spaces, and directly over and in physical contact with the silicon material of the first and second upper surface portions;
    depositing a layer of a hafnium carbide barrier material into the first and second void spaces and directly over an in physical contact with the layer of the insulator material, wherein the hafnium carbide barrier material is deposited so as to comprise barrier material properties;
    depositing a layer of an ytterbium silicide workfunction material into the first and second void spaces and directly over and in physical contact with the layer of the hafnium carbide material, wherein the ytterbium silicide workfunction material is deposited so as to comprise workfunction material properties;
    etching the layer of the hafnium carbide barrier material and the layer of the ytterbium silicide workfunction material from the first void space, but not the second void space;
    depositing a layer of a titanium nitride barrier material into the first and second void spaces, wherein the titanium nitride barrier material is deposited so as to comprise barrier material properties; and
    depositing a layer of a workfunction cobalt metal or a nickel metal into the first and second void spaces so as to completely fill the first and second void spaces, wherein the workfunction cobalt or nickel metal is deposited so as to comprise workfunction material properties.

10. The method of claim 9, wherein depositing a layer of a titanium nitride material is performed after etching the layer of the hafnium carbide material and the layer of the ytterbium silicide workfunction material from a first area.

11. The method of claim 10, wherein the first area comprises one or more p-type transistors.

12. The method of claim 11, wherein depositing a layer of a cobalt metal or a nickel metal is performed after depositing a layer of a titanium nitride material.

13. The method of claim 12, wherein fabricating an integrated circuit comprises fabricating at least one p-type transistor and at least one n-type transistor.

14. A method of fabricating an integrated circuit, comprising:
   forming or providing a semiconductor substrate consisting of a silicon material with a layer of a silicon oxide material directly overlying and in physical contact with the semiconductor substrate, wherein first and second void spaces are formed in the silicon oxide material thereby exposing first and second upper surface portions of the semiconductor substrate;
   depositing a layer of an insulator material directly over and in physical contact with the silicon oxide material, within the first and second void spaces, and directly over and in physical contact with the silicon material of the first and second upper surface portions;
   depositing a layer of a first barrier material directly over and in physical contact with the layer of the insulator material so as to be present over the silicon oxide material, within the first and second void spaces, and over the first and second upper surface portions, wherein the first barrier material is deposited in a manner so as to comprise barrier material properties;
   depositing a layer of an n-type workfunction material directly over and in physical contact with the layer of the first barrier material, wherein the n-type workfunction material is deposited in a manner so as to comprise workfunction material properties;
   etching the layer of the first barrier material and the layer of the n-type workfunction material from a first area, wherein the first area includes at least an entirety of the first void space but does not include any of the second void space;
   depositing a layer of a second barrier material, wherein the second barrier material is deposited in a manner so as to comprise barrier material properties; and
   depositing a layer of a p-type workfunction material, wherein the p-type workfunction material is deposited in a manner so as to comprise workfunction material properties.

15. The method of claim 14, wherein the layer of the second barrier material is deposited within the first and second void spaces, and, as to the first void space, is deposited directly over and in physical contact with the layer of the insulator material, and, as to the second void space, is deposited directly over and in physical contact with the layer of the n-type workfunction material.

16. The method of claim 15, wherein the layer of the p-type work function material is deposited directly over and in physical contact with the layer of the second barrier material in both the first and second void spaces.

17. The method of claim 16, wherein the layer of the p-type work function material is deposited in a manner so as to completely fill the first and second void spaces.

18. The method of claim 17, wherein fabricating the integrated circuit comprises fabricating at least one p-type transistor and at least one n-type transistor.

* * * * *